United States Patent
Chuang et al.

(10) Patent No.: US 9,865,610 B2
(45) Date of Patent: Jan. 9, 2018

(54) SI RECESS METHOD IN HKMG REPLACEMENT GATE TECHNOLOGY (71) Applicant: Taiwan Semiconductor Manufacturing Co., Ltd., Hsin-Chu (TW)

(72) Inventors: Harry-Hak-Lay Chuang, Zhubei (TW); Wei Cheng Wu, Zhubei (TW); Chin-Yi Huang, Hsinchu (TW); Shih-Chang Liu, Alian Township (TW); Chang-Ming Wu, New Taipei (TW)

(73) Assignee: Taiwan Semicondutor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/438,907

(22) Filed: Feb. 22, 2017

(65) Prior Publication Data
US 2017/0162590 A1    Jun. 8, 2017

Related U.S. Application Data (62) Division of application No. 14/210,796, filed on Mar. 14, 2014, now Pat. No. 9,583,591.

(51) Int. Cl.
H01L 27/11       (2006.01)
H01L 27/115      (2017.01)
H01L 27/11534    (2017.01)
H01L 29/66       (2006.01)
H01L 27/11521    (2017.01)

(52) U.S. Cl.
CPC .. *H01L 27/11534* (2013.01); *H01L 27/11521* (2013.01); *H01L 29/66545* (2013.01)

(58) Field of Classification Search
CPC .......... H01L 21/0237; H01L 21/02439; H01L 21/02521; H01L 31/0256
See application file for complete search history.

(56) References Cited

U.S. PATENT DOCUMENTS 6,207,588 B1     3/2001  Choi et al.
6,569,729 B1     5/2003  Wu et al.
2011/0256677 A1  10/2011 Chuang et al.
2013/0264652 A1  10/2013 Zhu et al.

OTHER PUBLICATIONS

Samsung. "Samsung Foundry 32/28nm Low-Power High-K Metal Gate Logic Process and Design Ecosystem." Mar. 2011, 2 Pages.
Non-Final Office Action dated Nov. 18, 2015 for U.S. Appl. No. 14/210,796.
Non-Final Office Action dated May 24, 2016 for U.S. Appl. No. 14/210,796.
Notice of Allowance dated Oct. 20, 2016 for U.S. Appl. No. 14/210,796.

*Primary Examiner* — Benjamin Sandvik
*Assistant Examiner* — Damon Hillman
(74) *Attorney, Agent, or Firm* — Eschweiler & Potashnik, LLC (57) ABSTRACT The present disclosure relates to an integrated circuit (IC). The IC includes a substrate, which includes a periphery region having a first substrate surface and a memory cell region having a second substrate surface. The second substrate surface is recessed within the substrate relative to the first substrate surface. A high k metal gate (HKMG) transistor is disposed on the first substrate surface and includes a HKMG gate. Two neighboring flash memory cells are disposed on the second substrate surface and include a pair of flash memory cell control gates. Top surfaces of the HKMG gate and flash memory cell control gates are coplanar.

20 Claims, 9 Drawing Sheets

SI RECESS METHOD IN HKMG REPLACEMENT GATE TECHNOLOGY

REFERENCE TO RELATED APPLICATION

This Application is a Divisional of U.S. application Ser. No. 14/210,796 filed on Mar. 14, 2014, the contents of which is hereby incorporated by reference in its entirety.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

High-k metal gate (HKMG) technology has become one of the front-runners for the next generation of CMOS devices. This technology incorporates a high-k dielectric, which reduces leakage and improves the dielectric constant. To help with fermi-level pinning and to allow the gate to be adjusted to low threshold voltages, a metal gate is used instead of a polysilicon gate. By combining the metal gate and low-k dielectric, HKMG technology reduces gate leakage, thereby increasing the transistor capacitance and allowing chips to function with reduced power needs. HKMG process technology involves two distinctly different integration flows, namely traditional gate and replacement gate. In a traditional gate approach, the transistor's gate stack is fabricated first, followed by the source and drain, very much like traditional CMOS transistor architecture. A replacement gate process is just the opposite, where a sacrificial gate stack is stripped away to form a recess after source and drain regions have been formed, and a replacement gate is fabricated in the recess after formation of the source and drain regions.

Flash memory is an electronic non-volatile computer storage medium that can be electrically erased and reprogrammed. Super-flash is a highly reliable and versatile type of NOR flash memory and NOR is a form of random access nonvolatile memory that allows electronic systems to retain information when the power source is turned off. Through scaling and evolution, the memory cell retains its split-gate structure, poly-to-poly Fowler-Nordheim (FN) tunneling erase, and Source-Side Hot Channel Electron (SS HCE) injection programming. To further enhance the scaling of the split-gate memory cell, a coupling gate/control gate (CG) is introduced in Super Flash's third generation (ESF3) technology.

In conventional process flows, silicon nitride (SiON) ESF3 memory can only be embedded in traditional gate HKMG technology and is not compatible with replacement HKMG technology. The reason for this incompatibility stems from a chemical mechanical polishing (CMP) process used in the replacement gate process. This CMP process is performed right before the sacrificial gate stack is removed, and planarizes the structure until the top surface of the sacrificial gate stack is reached. If SiON ESF3 memory is embedded in the replacement gate process, the above mentioned CMP process will damage the CGs of the ESF3 memory cells because the CGs of the ESF3 memory stand taller than the sacrificial gate stack.

Accordingly, the present disclosure relates to a new processing method which allows embedding SiON ESF3 memory in the replacement gate HKMG technology. Here, a portion of the Si substrate where the ESF3 memory would be embedded is recessed to a depth below the height of the original substrate, such that the HKMG circuitry is formed on an un-recessed Si substrate and the ESF3 memory is formed on a recessed Si substrate. This recession will align the top surfaces of the CGs of the ESF3 memory and the sacrificial gate stack of the HKMG transistor, horizontally. In other words the top surfaces of the CGs and the sacrificial gate will become co-planar. Thus, the Si recess would embed the ESF3 memory at a lower height level with respect to the HKMG circuitry so that the CMP process would stop at the top surface of the CGs and not damage them.

Figure 1:
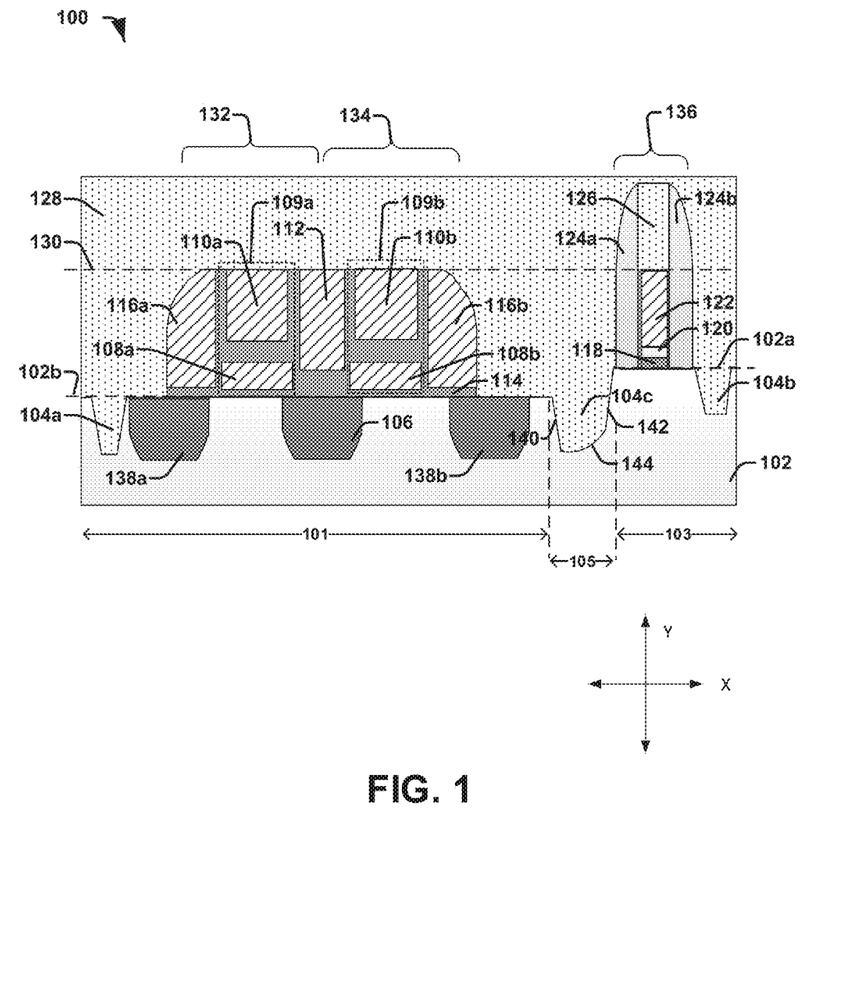
FIG. 1 illustrates a cross sectional view of an integrated circuit with a pair of flash memory cells disposed on a recessed substrate and a high-k metal gate (HKMG) circuitry disposed on an un-recessed substrate according to some embodiments of the present disclosure.

FIG. 1 illustrates a cross sectional view of an integrated circuit 100 with a pair of flash memory cells disposed on a recessed substrate and a high-k metal gate (HKMG) circuitry disposed on an un-recessed substrate according to some embodiments of the present disclosure. Integrated circuit 100 resides on a Si substrate 102 which has a recessed region 101 and an un-recessed region 103, with a transition region 105 there between. Top surface of the un-recessed region 103 or the original top surface of the Si substrate 102 is represented by horizontal line 102a. Top surface of the recessed region 101 is represented by horizontal line 102b.

A pair of adjacent flash memory cells 132, 134 resides on the recessed substrate region 101. The flash memory cells 132, 134 comprise control gate structures 109a, 109b, wherein each control gate structure comprises a thicker CG (e.g., 110a) which is disposed above a thinner yet wider floating gate (FG) (e.g., 108a). The memory cells share a common erase gate (EG) 112 and common source/drain region 106. Select gates (SG) 116a, 116b are disposed on the opposing ends of each control gate structures 109a, 109b over source/drain regions 138a, 138b, respectively. A dielectric 114 is seen between the gates of the flash memory cells. The source/drain regions 106, 138a, 138b have an electrical conductivity that is different from that of channel regions in Si substrate 102.

A HKMG transistor 136, which is illustrated at an intermediate stage in the manufacturing process, resides on top of the un-recessed substrate region 103. Touching the un-recessed substrate surface 102a is a high-k dielectric layer 118 and above that, an etch-stopping layer 120 is disposed. A sacrificial gate 122 is formed above the metal etch-stopping layer 120. A dielectric hard mask 126 resides above the sacrificial gate 122 and sidewall spacers 124a and 124b are disposed on either side of the sacrificial gate 122. An inter-layer dielectric (ILD) 128 is deposited entirely over the devices, covering their top surfaces as well as surrounding them.

As will be appreciated in greater detail below, forming the memory cells 132, 134 on the recessed Si substrate region 101 (having the top surface 102b) helps ensure the memory cells are disposed at a lower height level than the HKMG circuitry, such that the top surfaces of the pair of control gates 110a and 110b are co-planar with the top surface of the sacrificial gate 122 (as shown by horizontal line 130). Thus, when a CMP process is performed on an ILD layer 128 to stop at the level of horizontal line 130, the CMP process will not destroy or overly erode the CGs 110a and 110b. For comparison, in previous processes where the memory cells and HKMG transistor were formed on a planar substrate (i.e, when recessed Si substrate region 101 was not utilized), the CGs 110a, 110a would tend to "stick up" higher over the upper surface of sacrificial gate 122, and hence the CMP process would tend to "chop off" the top portion of the CGs 110a, 110b and thereby damage the memory cells 132, 134. The use of the recessed and un-recessed regions 101, 103 reduces this damage.

Isolation zone 104c, which is formed in the transition region 105 and which has an asymmetric geometry about the y-axis, is a signature feature for ESF3 memories embedded on replacement gate HKMG technologies and it can be utilized as a distinguishable feature for various imaging processes. Two isolation zones that are symmetric about a y-axis are also illustrated as 104a and 104b. Symmetric isolation zone 104a resides on the recessed Si region 101 while symmetric isolation zone 104b resides on the un-recessed Si region 103.

Figure 2:
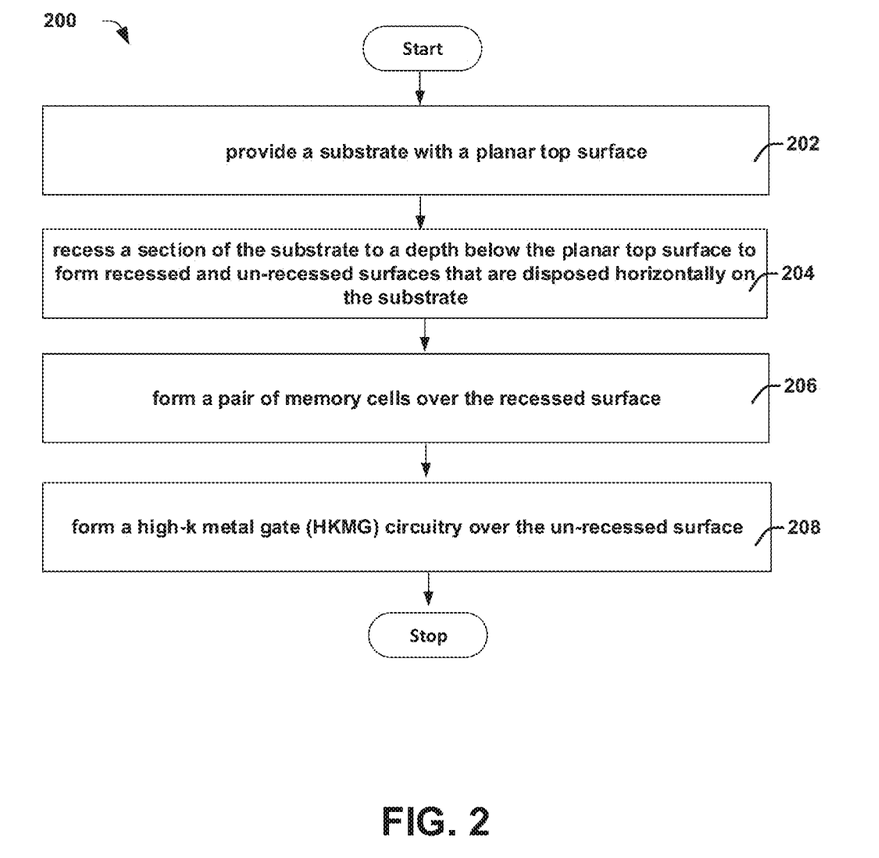
FIG. 2 illustrates a flow diagram of some embodiments of a method for forming an integrated circuit according to the present disclosure.

FIG. 2 illustrates a flow diagram of some embodiments of a method 200 for forming an integrated circuit according to the present disclosure. While disclosed method 200 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a substrate with a planar top surface is provided. In some embodiments, the substrate comprises Si.

At 204, a section of the substrate is recessed to a depth below the planar top surface, resulting in the formation of recessed and un-recessed surfaces that are horizontally disposed on the substrate.

At 206, a pair of memory cells is formed over the recessed surface of the substrate. In some embodiments, the memory cells comprise split gate flash memory cells.

At 208, a HKMG circuitry is formed over the un-recessed surface of the substrate. In some embodiments, the HKMG circuitry comprises a static random access memory (SRAM) cell, an input/output cell or a core cell.

Figure 3:
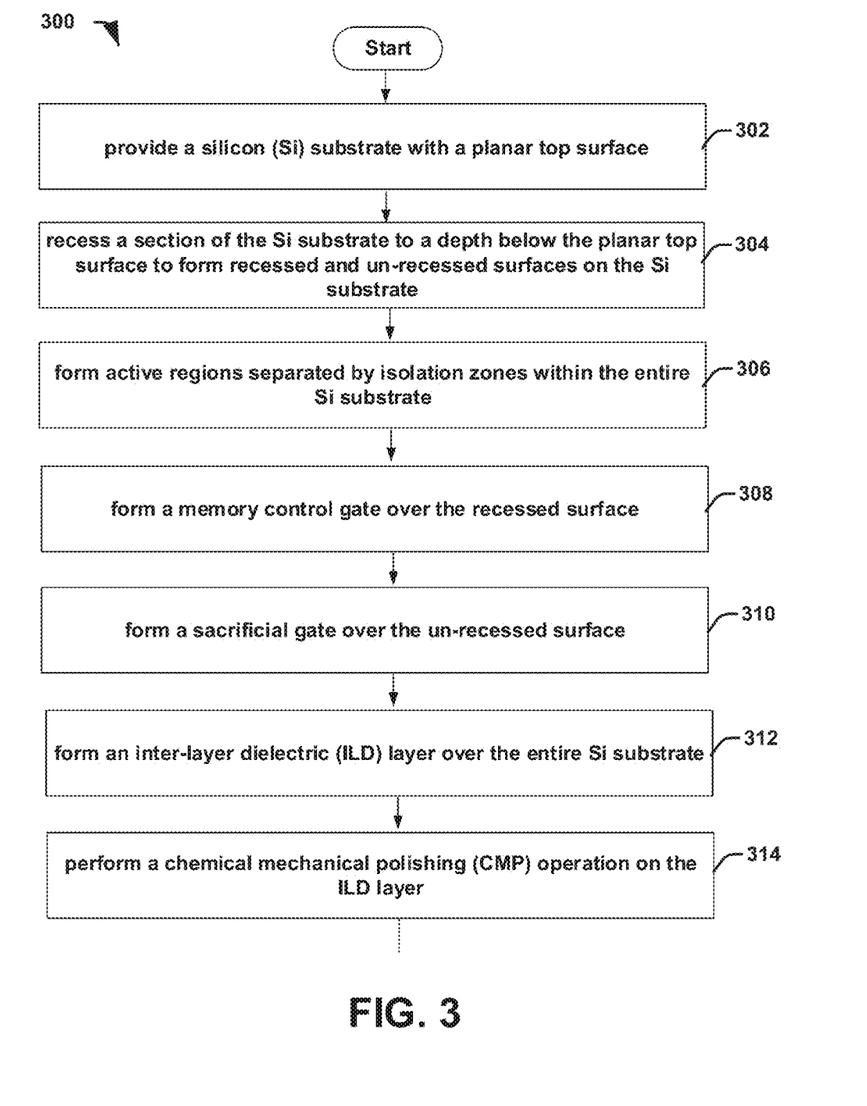
FIG. 3 illustrates a flow diagram of some embodiments of a detailed method for forming an integrated circuit till a certain stage of its formation, according to the present disclosure.

FIG. 3 illustrates a flow diagram of some embodiments of a detailed method for forming an integrated circuit until a certain stage of its formation, according to the present disclosure. While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a Si substrate with a planar top surface is provided.

At 304, a section of the Si substrate is recessed to a depth below the planar top surface, to form recessed and un-recessed surfaces on the Si substrate.

At 306, active regions separated by isolation zones are formed within the entire Si substrate. In some embodiments, the isolation zones comprise shallow trench isolation (STI) regions filled with a dielectric material. The isolation zone within the transition region between the recessed and the un-recessed surface comprises an asymmetrical geometry.

At 308, a memory control gate is formed over the recessed surface on the Si substrate. The memory control gate is formed over a floating gate.

At 310, a sacrificial gate is formed over the un-recessed surface on the Si substrate. The sacrificial gate is formed over a high-k dielectric layer. In some embodiments, the top surface of the sacrificial gate and the memory control gate are co-planar.

At 312, an ILD layer if formed over the entire Si substrate. In some embodiments, the ILD layer is an oxide.

At 314, a CMP operation is performed on the ILD layer which stops at the top surface of the sacrificial gate and hence at the top surface of the memory control gate.

FIGS. 4A-4K illustrate embodiments of cross sectional images of the step by step method 300 for the formation of a recessed substrate surface with isolation zones, according to the present disclosure.

Figure 4A:
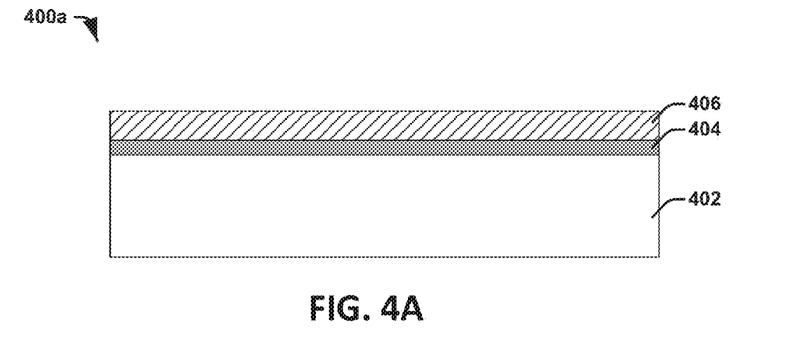
FIGS. 4A-4K illustrate embodiments of cross sectional images of a step by step method of formation of a recessed substrate surface with isolation zones, according to the present disclosure.

FIG. 4A illustrates a cross sectional image of a semiconductor body 400a having an oxide layer 404 over a Si substrate 402. A silicon nitride (SiN) layer 404 is deposited over the entire oxide layer 404. In some embodiments, the thickness of the oxide layer 404 is 30 Angstroms and the thickness of the SiN layer 404 is 200 Angstroms.

Figure 4B:
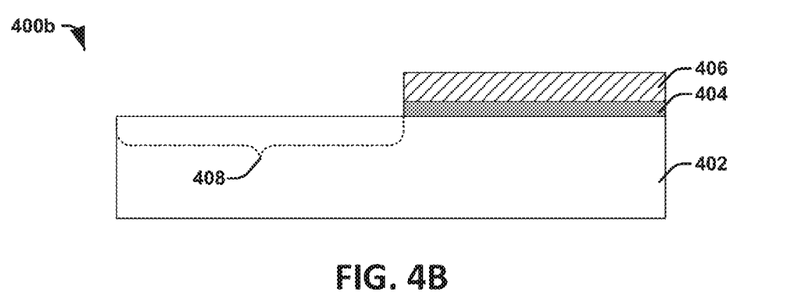

FIG. 4B illustrates a cross sectional image of a semiconductor body 400b, where the oxide layer 404 and the SiN layer 406 is removed from a defined region 408 from the Si substrate 402. The defined region 408 is the memory cell region and in some embodiments, the oxide layer 404 and the SiN layer 406 is removed using photo lithography.

Figure 4C:
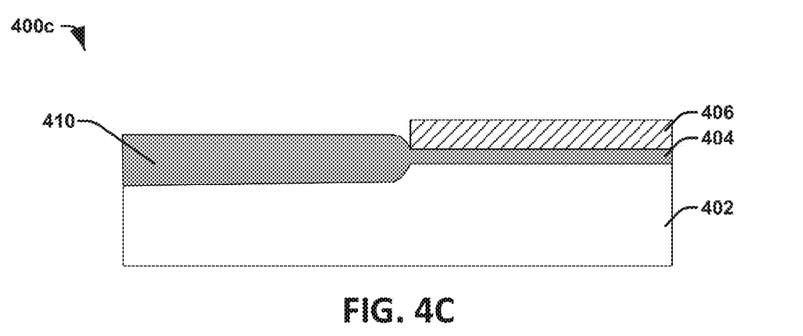

FIG. 4C illustrates a cross sectional image of a semiconductor body 400c, where an oxide 410 is grown over the Si substrate 402 in the defined region 408. In some embodiments, the oxide 410 is grown by wet oxidation.

Figure 4D:
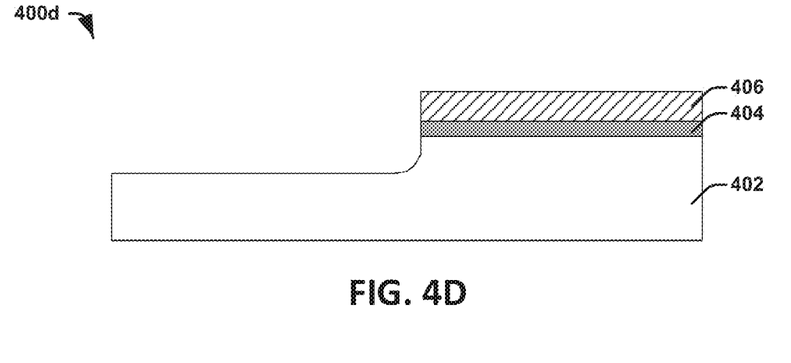

FIG. 4D illustrates a cross sectional image of a semiconductor body 400d, after removing the oxide 410 from the Si substrate 402, thereby creating a recessed region over the substrate 402. In some embodiments the oxide 410 is removed by wet etching or by a combination of wet etching and dry etching. In some embodiments an oxide thickness ranging between 400-1000 Angstroms is removed to create a recess depth ranging between 150-800 Angstroms.

Figure 4E:
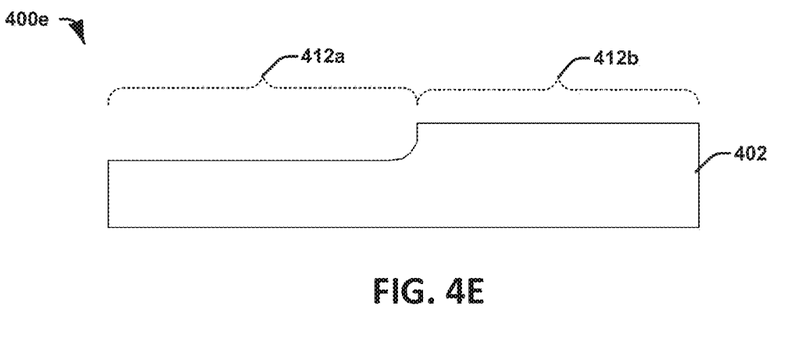

FIG. 4E illustrates a cross sectional image of a semiconductor body 400e, where the remaining oxide layer 404 and the SiN layer 406 are removed from the Si substrate. 412a represents a recessed Si substrate surface or a memory cell region and 412b represents an un-recessed Si substrate surface or a HKMG circuitry region. In some embodiments, the recessed Si substrate surface 412a can be formed by dry etching a defined region that needs to be recessed. In some embodiments, the dry etching is followed by wet oxidation of the recessed Si substrate to prevent damage to the recessed Si substrate 412a.

Figure 4F:
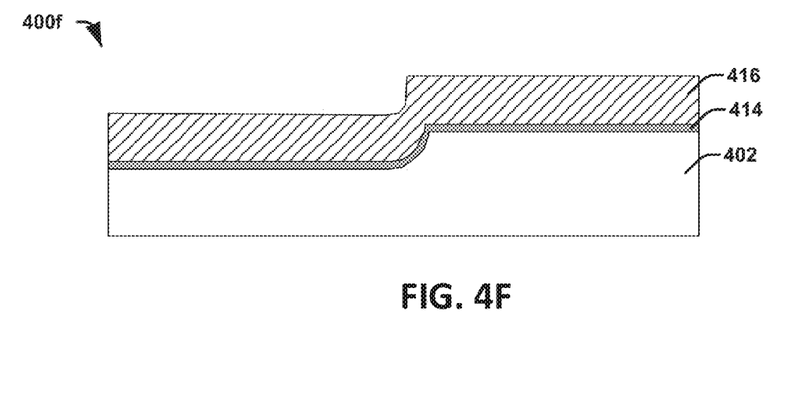

FIG. 4F illustrates a cross sectional image of a semiconductor body 400f, where an oxide layer 414 is formed over the entire recessed and un-recessed Si substrate 402, followed by the deposition of another SiN layer 416. In some embodiments, the oxide layer 414 comprises a thickness of 90 Angstroms and the SiN comprises a thickness of 800 Angstroms.

Figure 4G:
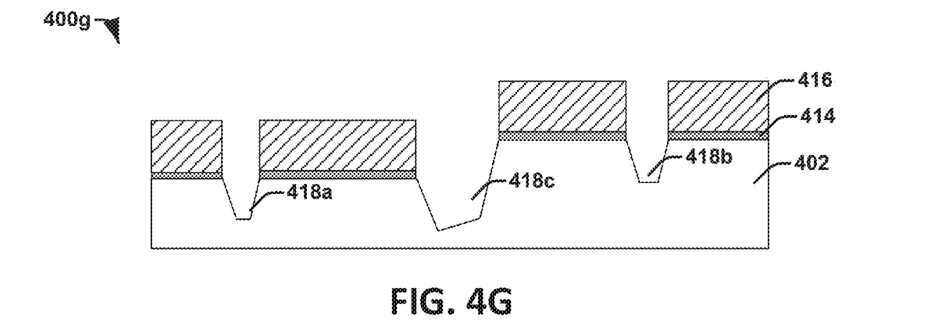

FIG. 4G illustrates a cross sectional image of a semiconductor body 400g, after forming active regions and shallow trenches for isolations zones. In some embodiments, the shallow trenches are formed by forming a mask over the SiN layer, the mask covering some portions of the SiN layer while leaving other regions of the SiN layer exposed and performing a dry etch to remove the exposed portions of the SiN layer and the corresponding Si layer underneath. The shallow trench 418a is formed in the recessed region of the substrate 402 and the shallow trench 418b is formed in the un-recessed region of the substrate 402. Trench 418c is formed in the transition region between the recessed and the un-recessed surfaces and hence it has a different geometry from the other trenches. Trenches 418a and 418b are symmetrical along a vertical axis or a y-axis whereas trench 418c is asymmetrical along y-axis.

Figure 4H:
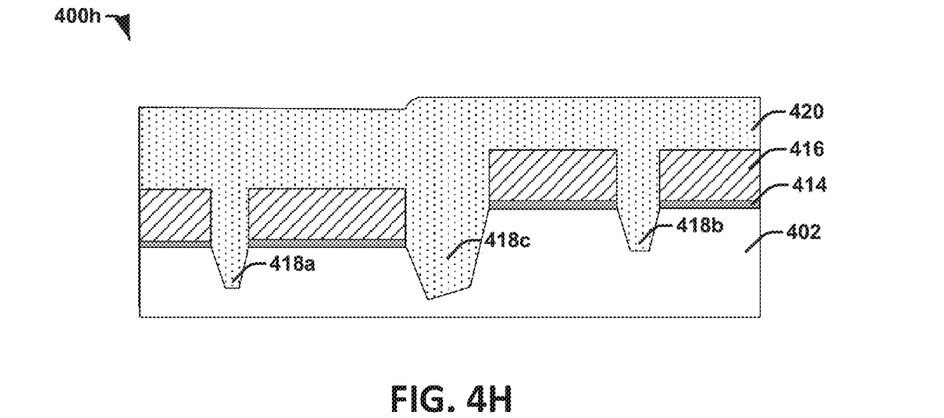

FIG. 4H illustrates a cross sectional image of a semiconductor body 400h, after depositing a shallow trench isolation (STI) oxide 420 over the entire Si substrate.

Figure 4I:
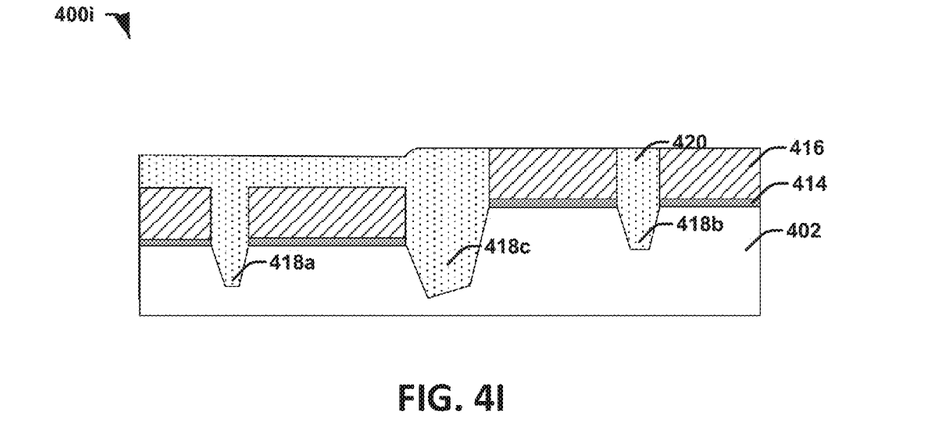

FIG. 4I illustrates a cross sectional image of a semiconductor body 400i, after performing a CMP process on the STI oxide 420 layer. The CMP stops at the top surface of SiN layer 416 that is over the un-recessed surface. This leaves a layer of the STI oxide 420 above the SiN layer 416 in the recessed surface.

Figure 4J:
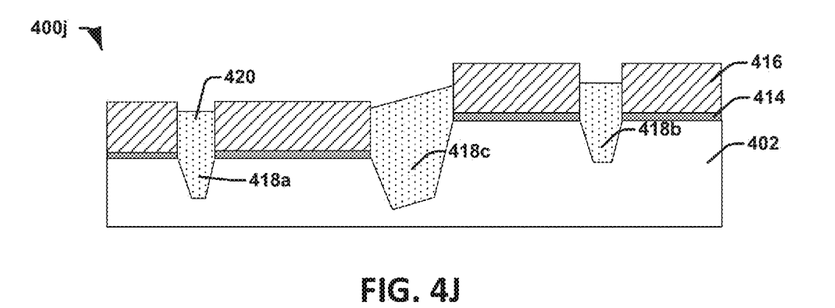

FIG. 4J illustrates a cross sectional image of a semiconductor body 400j, after performing a wet etching to control the step height of the STI oxide 420. In some embodiments, wet etching comprises a dip in dilute hydrogen fluoride (HF).

Figure 4K:
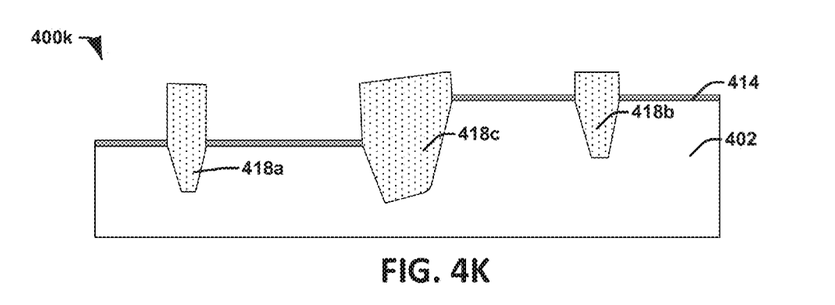

FIG. 4K illustrates a cross sectional image of a semiconductor body 400k, after removing the SiN layer 416 from the entire substrate. This will leave the Si substrate 402 with STI zones 418a, 418b and 418c and active regions with a thin layer of oxide 414 on their top surfaces.

FIGS. 5A-5D illustrate cross sectional images of an integrated circuit during different stages of a replacement gate process, according to the present disclosure.

Figure 5A:
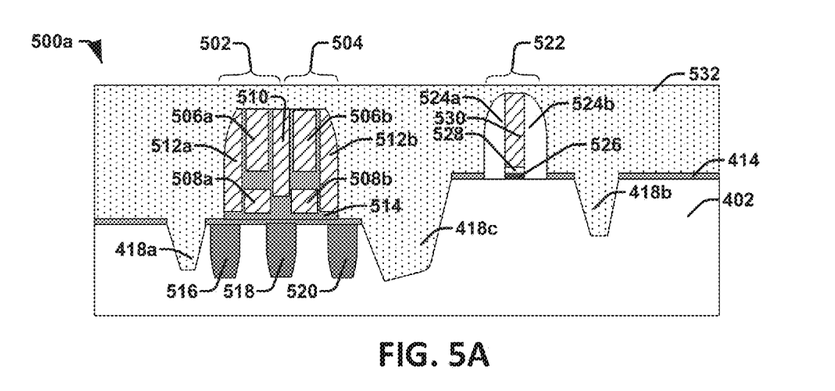
FIGS. 5A-5D illustrate cross sectional images of an integrated circuit during different stages of a replacement gate process, according to the present disclosure.

FIG. 5A illustrates a cross sectional image of a semiconductor body 500a, at a certain stage of processing. At this stage, ion well implants or source/drain implants 516, 518 and 520 are formed in the substrate 402. A pair of adjacent split gate flash memory cells 502 and 504 has been formed on the recessed substrate surface, where the memory cell 502 comprises a thicker CG 506a over a wider yet thinner FG 508a, and memory cell 504 comprises a thicker CG 506b over a thinner FG 508b. A shared EG 510 is seen between each of the control gate floating stack, and SGs 512a and 512b on opposing side of each of the control gate, floating gate stack. A dielectric 514 is also formed between the gates.

At this stage, a HKMG transistor 522 is also under formation over the un-recessed surface of the Si substrate 402. A sacrificial gate stack comprising a high-k dielectric layer 526, an etch-stopping layer 528 and a sacrificial gate 530, is formed over the un-recessed surface of the substrate 402. Side wall spacer 524a and 524b are seen on either side of the sacrificial gate stack. A dielectric hard mask 519 is formed above the sacrificial gate 530. An ILD layer 532 is deposited over the entire substrate 402 which encompasses the entire integrated circuit. Due to the recession of the substrate in the memory cell region, the height of the CGs 506a and 506b and the sacrificial gate stack 530 will be controlled in such a way that their top surfaces are co-planar.

Figure 5B:
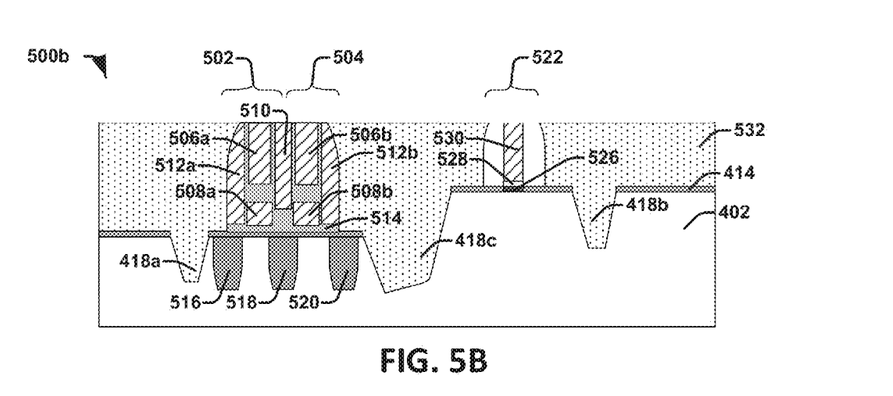

FIG. 5B illustrates a cross sectional image of a semiconductor body 500b, after performing a CMP over the semiconductor body 500a. The CMP process is designed to stop at the top surface of the sacrificial gate 530 and since the top surfaces of the CGs 506a and 506b are co-planar with the sacrificial gate 530, the CMP will not damage the CGs 506a and 506b of the memory cells 502 and 504.

Figure 5C:
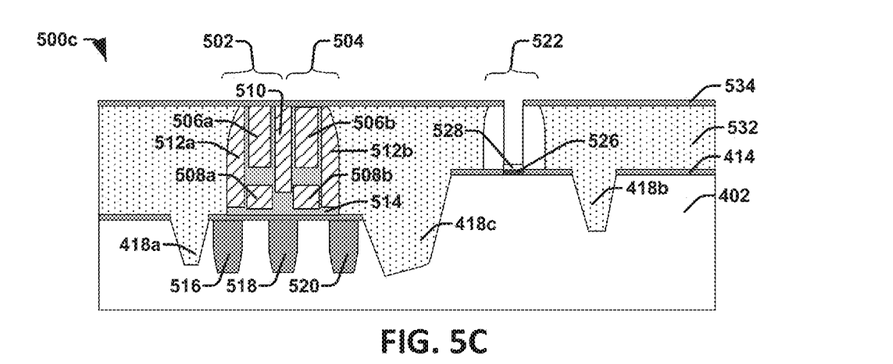

FIG. 5C illustrates a cross sectional image of a semiconductor body 500c, after removal of the sacrificial gate 530 from the HKMG transistor 522. An etch protection layer 534 is deposited on the top surfaces of the integrated circuit leaving only a region above the sacrificial gate 530 open. This etch protection layer 534 makes sure the rest of the device is not damaged during this replacement gate process. The etch-stop layer 528 comprises a metal and it protects the inside of the HKMG transistor 522 such that the poly silicon etch stops at the metal surface of the etch-stop layer 528.

Figure 5D:
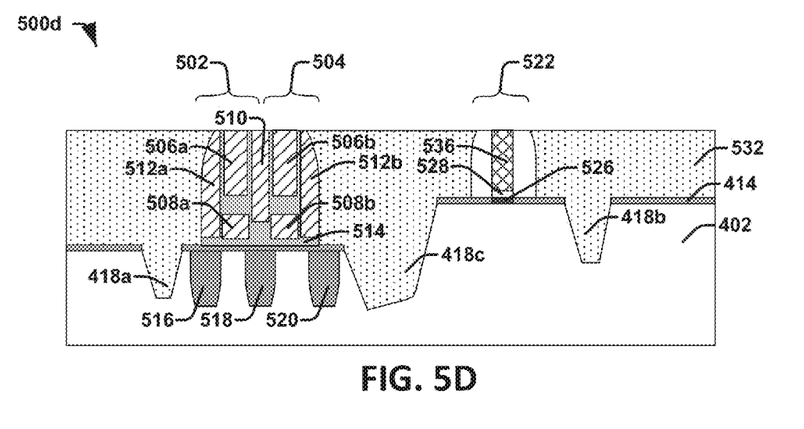

FIG. 5D illustrates a cross sectional image of a semiconductor body 500d, after formation of the metal gate 536. At this stage the replacement gate process is completed where a metal gate is deposited in the opening of the sacrificial gate 530. In some embodiments, the metal gate deposition comprises, depositing the metal gate layer entirely over the integrated circuit (with the etch-protection layer still covering the rest of the device), performing a CMP process to level the top the surface of the metal gate 536 and removing the protection layer 534.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a method of embedding a $3^{rd}$ generation super flash memory cell in a HKMG circuit that integrates a replacement gate technology of formation. The recessed substrate surface prepared for the memory cells will make sure the CGs of the memory cells are not damaged during the ILD CMP process, without sacrificing the features and dimensions of an ESF3 memory device. This method provides an asymmetrical STI zone in the transition region between the recessed and the un-recessed substrate surfaces which is a signature for this new methodology and this distinguished feature can be positively utilized during imaging techniques.

In some embodiments, the present disclosure relates to a method of forming an integrated circuit comprising, providing a substrate with a planar top surface, recessing a section of the substrate to a depth below the planar top surface to form recessed and un-recessed surfaces that are disposed horizontally on the substrate, forming a pair of memory cells over the recessed surface, and forming a high-k metal gate (HKMG) circuitry over the un-recessed surface.

In another embodiment, the present disclosure relates to a method of forming an integrated circuit comprising, providing a silicon (Si) substrate with a planar top surface, recessing a section of the Si substrate to a depth below the planar top surface to form recessed and un-recessed surfaces on the Si substrate, forming active regions separated by isolation zones within the entire Si substrate, forming a memory control gate over the recessed surface, forming a sacrificial high-k metal gate (HKMG) layer over the un-recessed surface, forming an inter-layer dielectric (ILD) layer over the entire Si substrate, and performing a chemical mechanical polishing (CMP) operation on the ILD layer, wherein the CMP operation stops to define top surfaces of the memory control gate for a memory cell and a sacrificial gate for a HKMG transistor.

In yet another embodiment, the present disclosure relates to an integrated circuit comprising, a substrate including a periphery region having a first substrate surface and a memory cell region having a second substrate surface, wherein the second substrate surface is recessed within the substrate relative to the first substrate surface, a high k metal gate (HKMG) transistor disposed on the first substrate surface and including a HKMG sacrificial gate and, two neighboring flash memory cells formed on the second substrate surface and including a pair of flash memory cell control gates, wherein top surfaces of the HKMG sacrificial gate and flash memory cell control gates are co-planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
    a substrate including a periphery region having a first substrate surface and a memory cell region having a second substrate surface, wherein the second substrate surface is recessed within the substrate relative to the first substrate surface;
    a high-k metal gate (HKMG) transistor disposed on the first substrate surface and including a gate electrode; and
    two neighboring flash memory cells formed on the second substrate surface and including a pair of flash memory cell control gates, wherein a top surface of the gate electrode is co-planar with top surfaces of the pair of flash memory cell control gates.

2. The integrated circuit of claim 1, wherein the substrate further comprises a transition region including a dielectric structure arranged between the peripheral region and the memory cell region.

3. The integrated circuit of claim 2, wherein the first and second substrate surfaces lie on parallel planes and the dielectric structure extends into the substrate along an axis that is perpendicular to the parallel planes, wherein the dielectric structure is asymmetric about the axis.

4. The integrated circuit of claim 1, wherein the two neighboring flash memory cells further comprise:
    a pair of control gate structures each comprising a flash memory control gate disposed above a floating gate;
    a pair of select gate structures disposed on opposite sides of the pair of control gate structures; and an erase gate disposed between the pair of control gate structures.

5. The integrated circuit of claim 4, wherein the floating gates, control gates, erase gate and the gate electrode of the HKMG transistor comprise poly silicon.

6. The integrated circuit of claim 1, wherein a distance as measured perpendicularly between a first plane corresponding to the first surface and a second plane corresponding to the second surface ranges from approximately 150 Angstroms to 800 Angstroms.

7. An integrated circuit, comprising:
a substrate including a periphery region having a first substrate surface and a memory cell region having a second substrate surface, wherein the second substrate surface is recessed within the substrate relative to the first substrate surface;
a logic transistor disposed on the first substrate surface and including a logic gate electrode separated from the first surface by a logic gate dielectric; and
a memory cell disposed on the second substrate surface and including a memory gate electrode separated from the second substrate surface by a memory gate dielectric, wherein a top surface of the logic gate electrode is co-planar with a top surface of the memory gate electrode.

8. The integrated circuit of claim 7, wherein the substrate further comprises a transition region including a dielectric structure arranged between the peripheral region and the memory cell region.

9. The integrated circuit of claim 8, wherein the first and second substrate surfaces lie on parallel planes and the dielectric structure extends into the substrate along an axis that is perpendicular to the parallel planes, wherein the dielectric structure is asymmetric about the axis.

10. The integrated circuit of claim 7, wherein the memory cell comprises:
a first individual source/drain region disposed in the memory cell region of the substrate;
a common source/drain region arranged in the memory cell region of the substrate, wherein a first channel region extends between the first individual source/drain region and the common source/drain region; and
wherein the memory gate electrode is arranged over the first channel region.

11. The integrated circuit of claim 10, further comprising:
a second individual source/drain region spaced apart from the first individual source/drain region in the substrate, wherein the common source/drain region is arranged between the first and second individual source/drain regions, and wherein a second channel region extends between the common source/drain region and the second individual source/drain region; and
a second memory gate electrode arranged over the second channel region and having a top surface that is co-planar with the top surfaces of the logic gate electrode and memory gate electrode.

12. The integrated circuit of claim 11, further comprising:
an erase gate over the common source/drain region and arranged between the memory gate electrode and the second memory gate electrode.

13. The integrated circuit of claim 12, wherein the erase gate has a top surface that is co-planar with the top surfaces of the logic gate electrode and memory gate electrode.

14. The integrated circuit of claim 12, wherein the logic gate electrode, memory gate electrode, second memory gate electrode, and erase gate are made of polycrystalline silicon.

15. The integrated circuit of claim 7, wherein a distance as measured perpendicularly between a first plane corresponding to the first substrate surface and a second plane corresponding to the second substrate surface ranges from approximately 150 Angstroms to 800 Angstroms.

16. An integrated circuit, comprising:
a substrate including a first region having a first substrate surface and a second region having a second substrate surface, wherein the second substrate surface is recessed within the substrate relative to the first substrate surface;
a first transistor disposed on the first substrate surface and including a first gate electrode separated from the first substrate surface by a first gate dielectric; and
a second transistor disposed on the second substrate surface and including a second gate electrode separated from the second substrate surface by a second gate dielectric, wherein a top surface of the first gate electrode is co-planar with a top surface of the second gate electrode.

17. The integrated circuit of claim 16, wherein a distance as measured perpendicularly between a first plane corresponding to the first substrate surface and a second plane corresponding to the second substrate surface ranges from approximately 150 Angstroms to 800 Angstroms.

18. The integrated circuit of claim 16, wherein the substrate further comprises a transition region including a dielectric structure arranged between the first region and the second region, wherein the first and second substrate surfaces lie on parallel planes and the dielectric structure extends into the substrate along an axis that is perpendicular to the parallel planes, wherein the dielectric structure is asymmetric about the axis.

19. The integrated circuit of claim 16, wherein the first transistor is included in a memory cell and the second transistor is a high-k metal gate transistor.

20. The integrated circuit of claim 19, wherein the memory cell comprises:
a first individual source/drain region disposed in the first region of the substrate;
a common source/drain region arranged in the first region of the substrate, wherein a first channel region extends between the first individual source/drain region and the common source/drain region; and
wherein the first gate electrode is arranged over the first channel region.

* * * * *